(12) United States Patent
Hara

(10) Patent No.: US 10,278,317 B2
(45) Date of Patent: Apr. 30, 2019

(54) BOARD WORKING DEVICE

(71) Applicant: FUJI CORPORATION, Chiryu (JP)

(72) Inventor: Kenji Hara, Kariya (JP)

(73) Assignee: FUJI CORPORATION, Chiryu (JP)

( * ) Notice: Subject to any disclaimer, the term of this patent is extended or adjusted under 35 U.S.C. 154(b) by 333 days.

(21) Appl. No.: 15/030,776

(22) PCT Filed: Oct. 21, 2013

(86) PCT No.: PCT/JP2013/078475
§ 371 (c)(1),
(2) Date: Apr. 20, 2016

(87) PCT Pub. No.: WO2015/059751
PCT Pub. Date: Apr. 30, 2015

(65) Prior Publication Data
US 2016/0286699 A1    Sep. 29, 2016

(51) Int. Cl.
*H05K 13/00* (2006.01)
*H05K 13/04* (2006.01)
*H05K 13/08* (2006.01)

(52) U.S. Cl.
CPC ..... *H05K 13/0061* (2013.01); *H05K 13/0404* (2013.01); *H05K 13/08* (2013.01); *H05K 2203/15* (2013.01)

(58) Field of Classification Search
CPC .... H05K 13/04; H05K 13/0417; H05K 13/08; H05K 13/0061; H05K 13/0404; H05K 2203/15
See application file for complete search history.

(56) References Cited

U.S. PATENT DOCUMENTS 6,634,094 B1 * 10/2003 Morita ............... H05K 13/08
29/739
7,142,939 B2 * 11/2006 Nonaka ............ G05B 19/41805
700/121

(Continued)

FOREIGN PATENT DOCUMENTS

EP     2 819 497 A1    12/2014
JP     4-346300 A      12/1992

(Continued)

OTHER PUBLICATIONS

International Search Report dated Apr. 28, 2014, in PCT/JP2013/078475 filed Oct. 21, 2013.

(Continued)

*Primary Examiner* — Carl Arbes
(74) *Attorney, Agent, or Firm* — Oblon, McClelland, Maier & Neustadt, L.L.P.

(57) ABSTRACT

A board working device includes: a board conveyance device; multiple heads; and a control device which performs control such that a printed circuit board is positioned in multiple locations in order from an upstream side relative to the progress direction of the printed circuit board, and work performed using a first head of the multiple heads, and further, once the work is completed by the first head at the most downstream side position out of the multiple locations relative to the progress direction of the printed circuit board, performs control such that work is started using a second head of the multiple heads, with the work of the second head being performed with the printed circuit board being positioned in order from a downstream side position out of the multiple locations relative to the progress direction of the printed circuit board.

7 Claims, 10 Drawing Sheets

(56) References Cited

U.S. PATENT DOCUMENTS

| | | |
|---|---|---|
| 2006/0085973 A1 | 4/2006 | Kodama et al. |
| 2006/0207090 A1 | 9/2006 | Kawada |
| 2011/0225811 A1 | 9/2011 | Kodama et al. |
| 2014/0026410 A1 | 1/2014 | Kodama et al. |
| 2015/0230344 A1 | 8/2015 | Kodama et al. |

FOREIGN PATENT DOCUMENTS

| | | | |
|---|---|---|---|
| JP | 2000013100 A | * | 1/2000 |
| JP | 2004-221518 A | | 8/2004 |
| JP | 2005-123371 A | | 5/2005 |
| JP | 2006-253457 A | | 9/2006 |
| JP | 2006-261325 A | | 9/2006 |
| JP | 2007-141966 A | | 6/2007 |
| JP | 4216984 B2 | * | 11/2008 |
| JP | 2010-4059 A | | 1/2010 |
| WO | WO 2013/124970 A1 | | 8/2013 |

OTHER PUBLICATIONS

Office Action dated Mar. 23, 2018 in Japanese Patent Application No. 2015-543589 (with unedited computer generated English translation), 8 pages.
Office Action dated Aug. 30, 2017 in Japanese Patent Application No. 2015-543589 (submitting English language translation only).
Extended European Search Report dated May 11, 2017 in European Patent Application No. 13895996.0.

* cited by examiner

[FIG. 1]
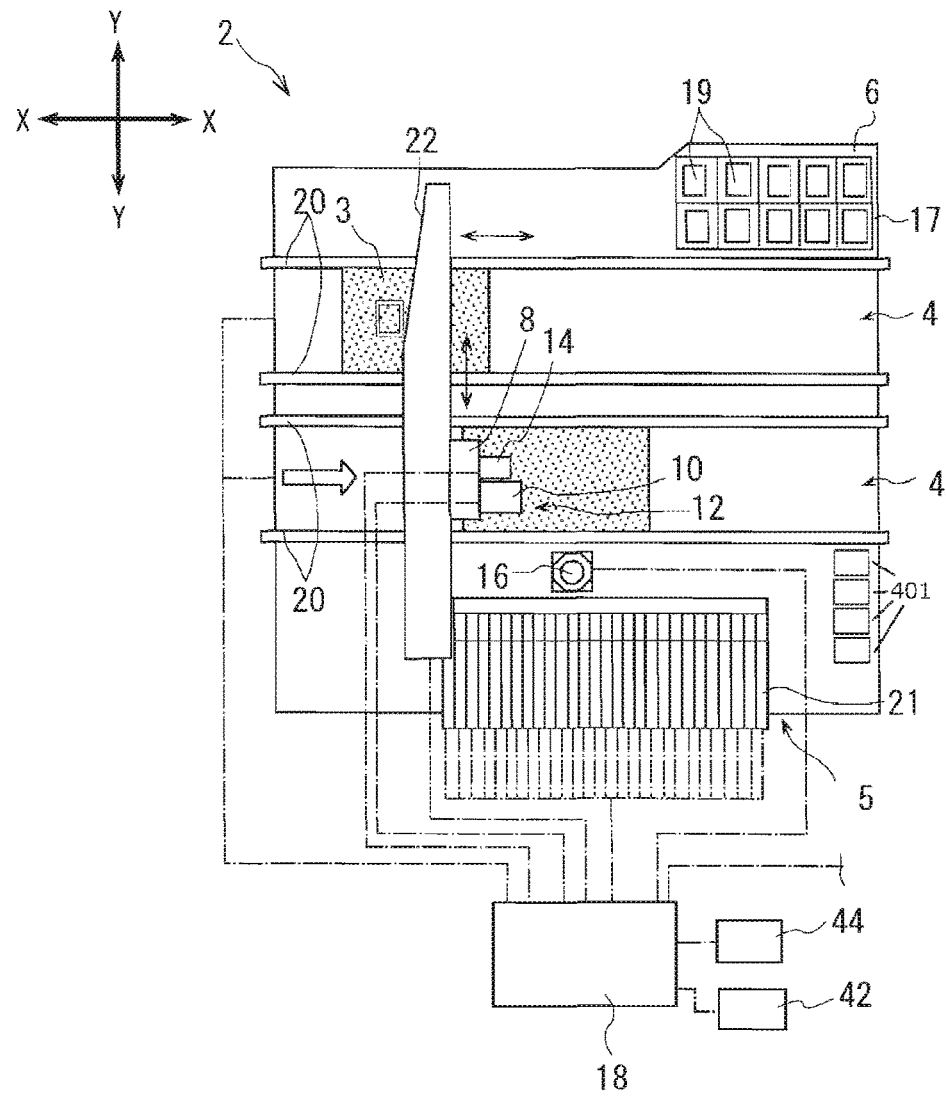
[FIG. 2]
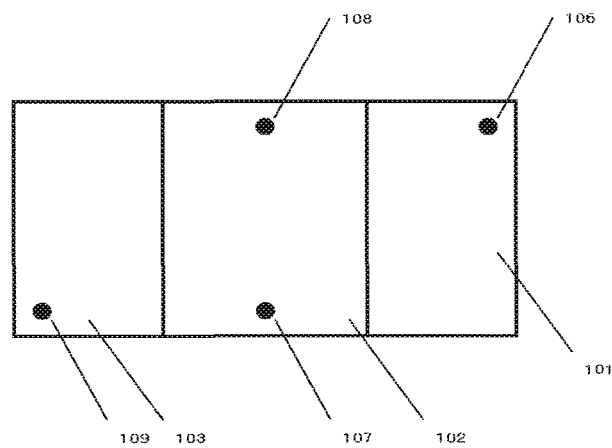

[FIG. 3]
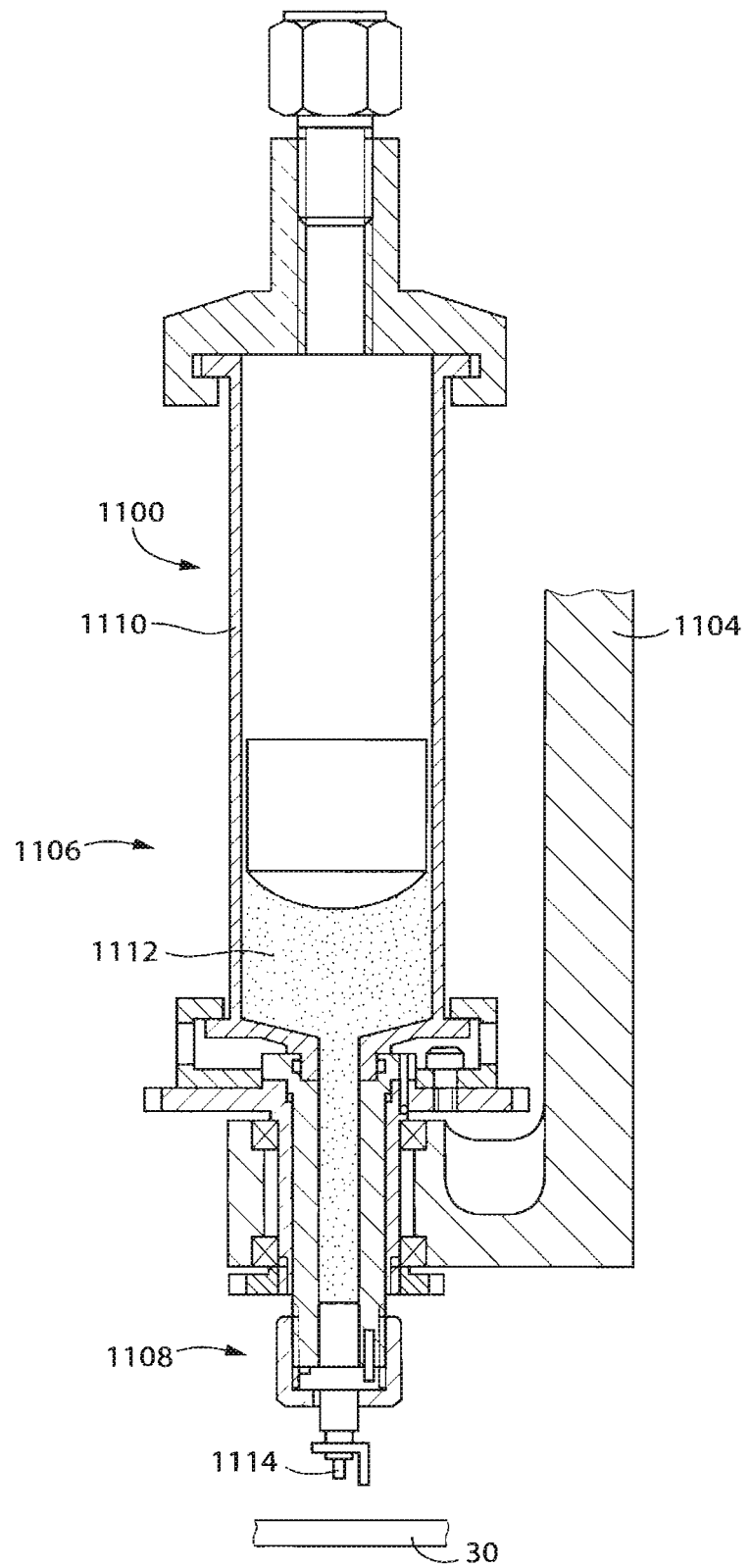

[FIG. 4]
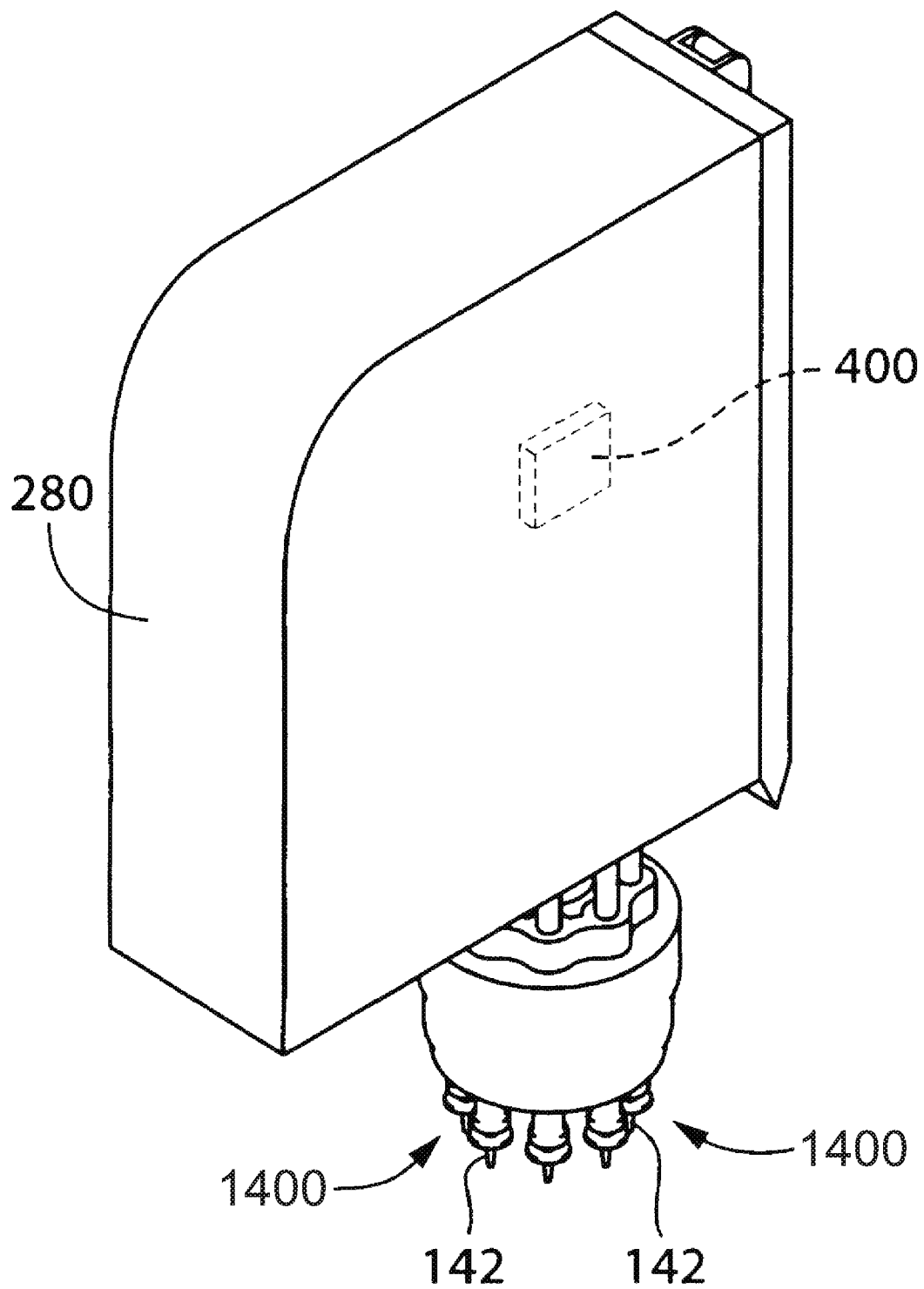

[FIG. 5]
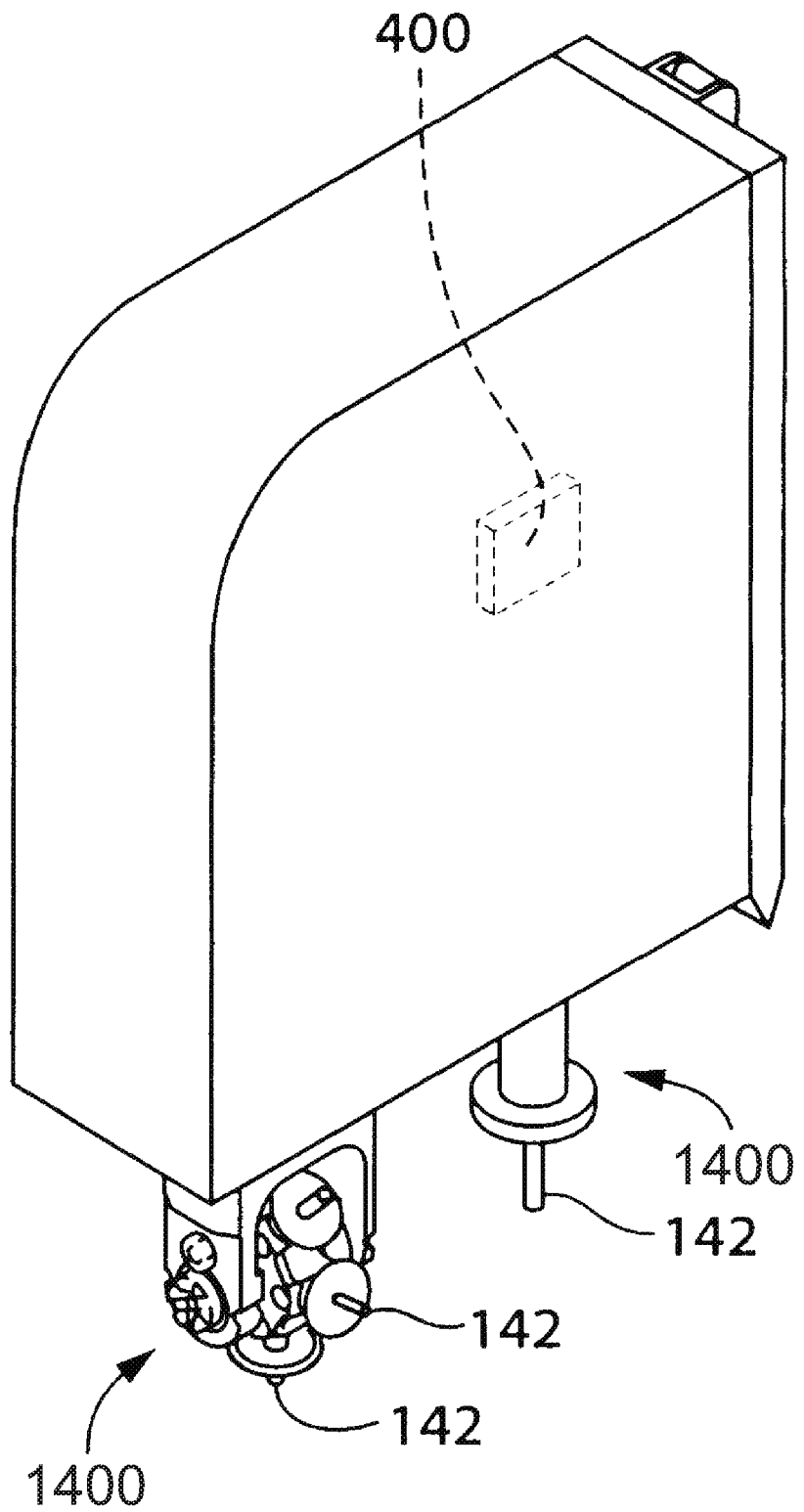

[FIG. 6]
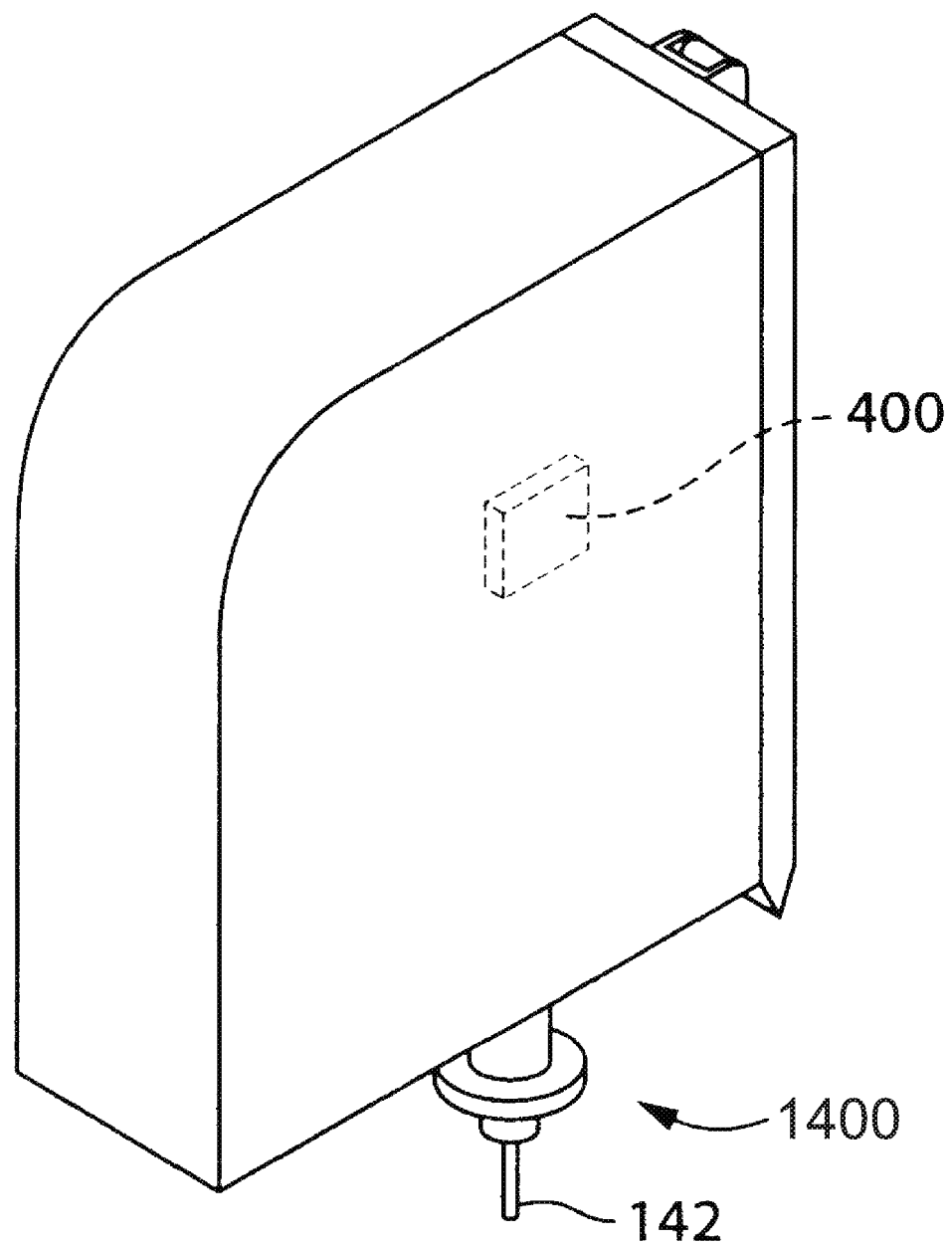

[FIG. 7]
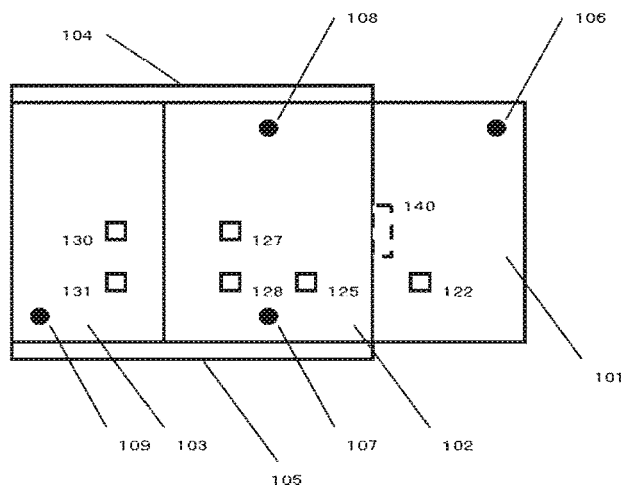
[FIG. 8]
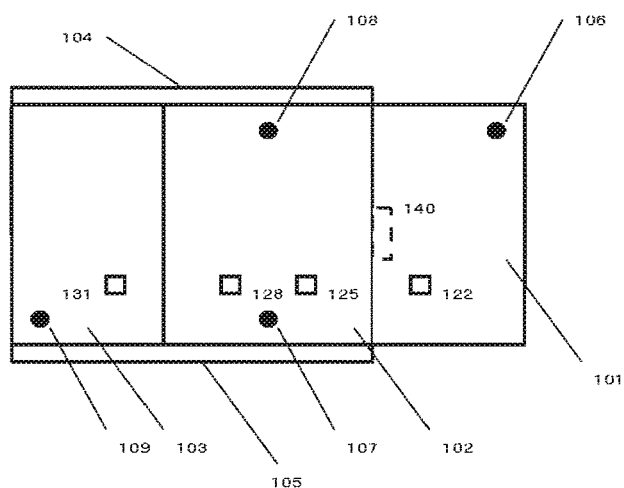
[FIG. 9]
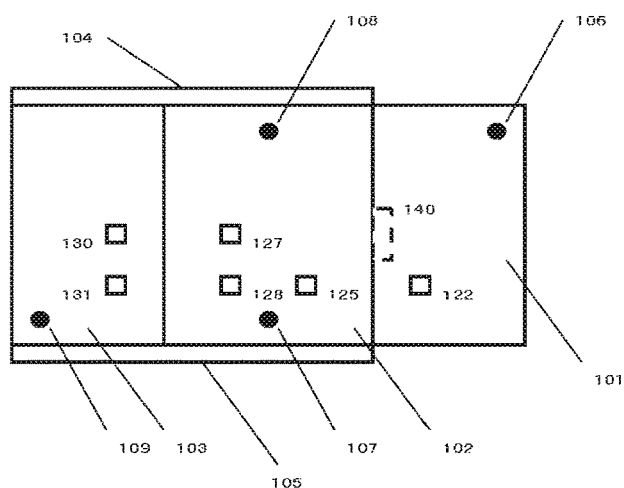

[FIG. 10]
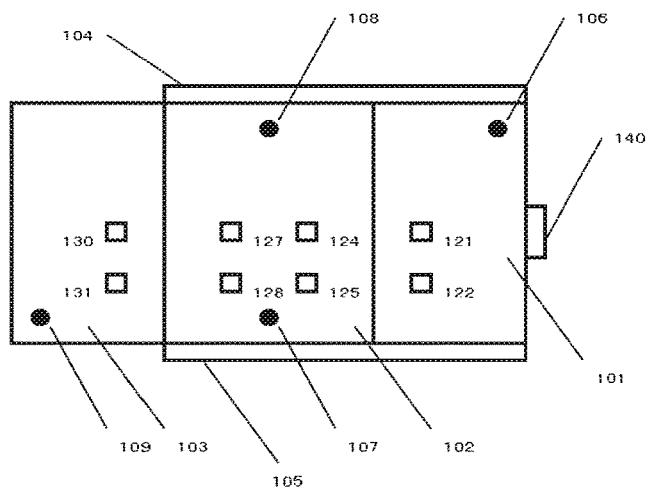
[FIG. 11]
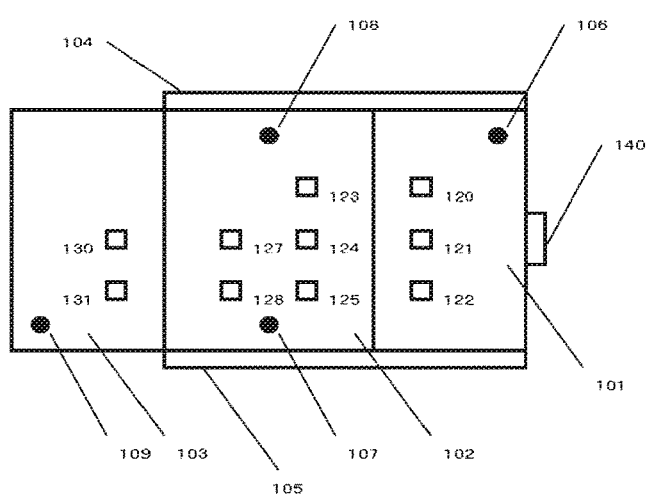
[FIG. 12]
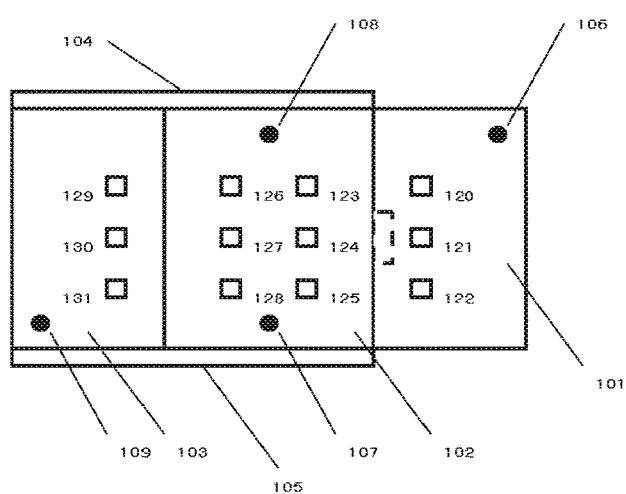

[FIG. 13]
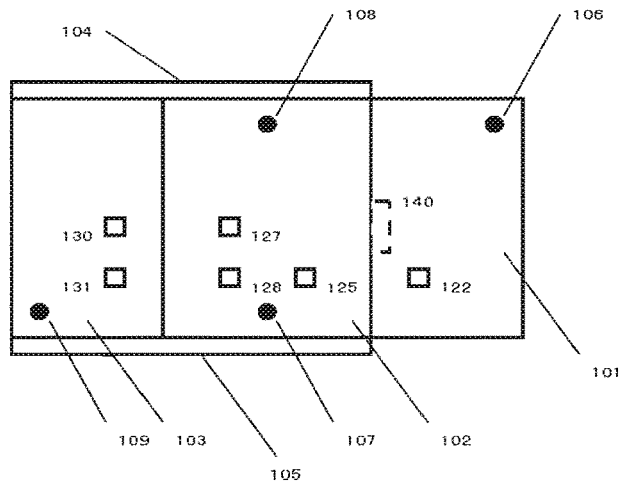
[FIG. 14]
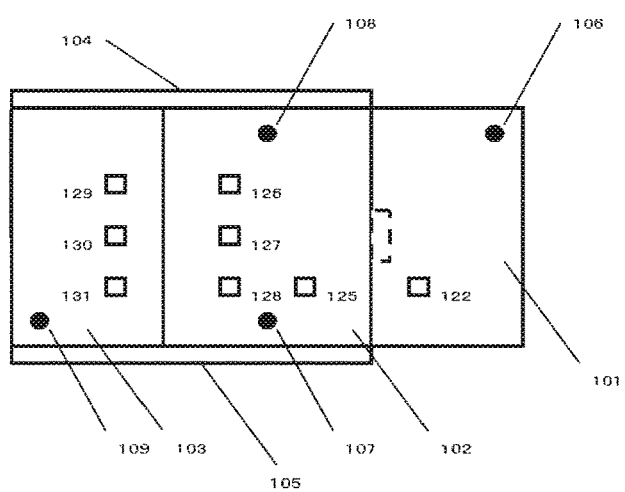
[FIG. 15]
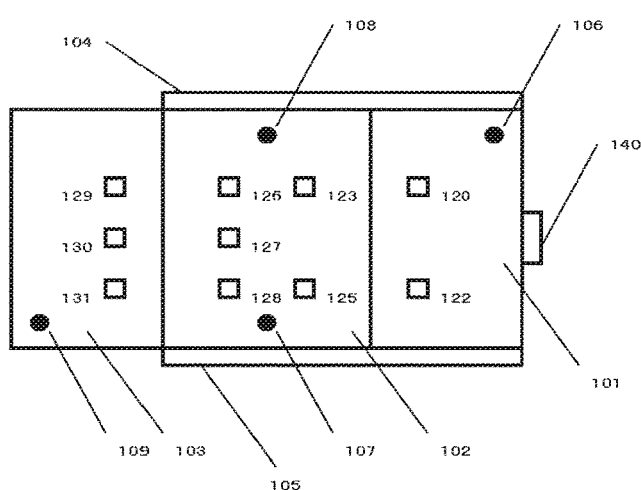

[FIG. 16]
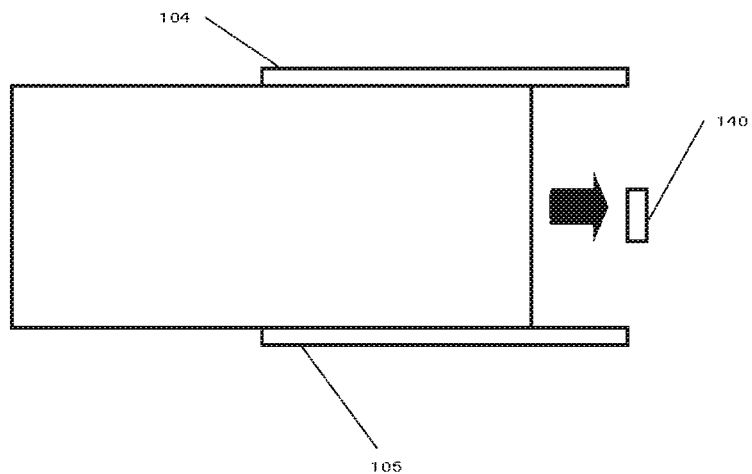
[FIG. 17]
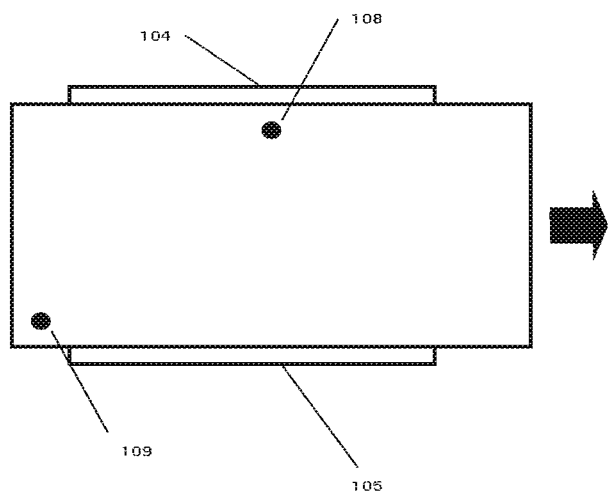
[FIG. 18]
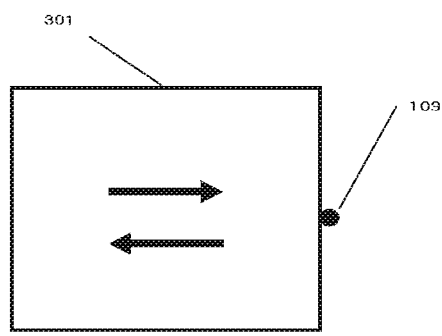

[FIG. 19]
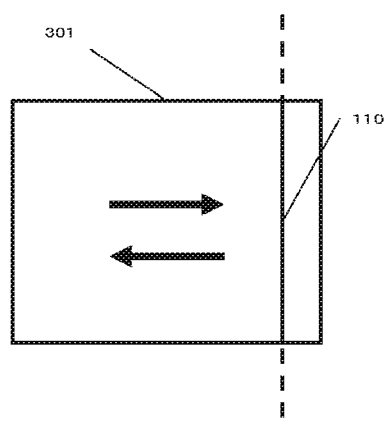

BOARD WORKING DEVICE

TECHNICAL FIELD

The present disclosure relates to the configuration of a device that uses a board conveyance device which positions a printed circuit board at multiple locations in a board working device, and multiple heads such as an application head, a high-speed head, a medium-speed head, and a low-speed head.

BACKGROUND ART

FIG. 1 discloses a board conveyance device and an electronic component mounting device that positions a printed circuit board at multiple locations in a board working device.

FIG. 2 discloses a device that uses multiple heads such as an application head, a high-speed head, a medium-speed head, and a low-speed head.

CITATION LIST

Patent Literature
  PTL 1: JP-A-2006-253457
  PTL 2: JP-A-2004-221518

SUMMARY

Problem to be Solved

In the patent literature described above, the configuration of a device that uses a board conveyance device which positions a printed circuit board at multiple positions in a board working device and multiple heads is not disclosed. Such a point is a problem when designing a board working device to achieve efficiency together with space saving.

The present disclosure was made in light of the problems in the related art, and solves them by providing the configuration of a device that uses a board conveyance device which positions a printed circuit board at multiple locations in a board working device, and multiple heads such as an application head, a high-speed head, a medium-speed head, and a low-speed head.

Means for Solving the Problem

In order to solve the problem described above, the disclosure according to an aspect provides a board working device comprising: a board conveyance device which conveys a printed circuit board and positions the printed circuit board at multiple locations in the board working device; multiple heads that perform work on the printed circuit board positioned at a working position; and a control device which performs control such that the printed circuit board is positioned in the multiple locations in order from an upstream side in relation to the progress direction of the printed circuit board, and work performed using a first head of the multiple heads, and further, once the work is completed by the first head at the most downstream side position out of the multiple locations in relation to the progress direction of the printed circuit board, performs control such that work is started using a second head of the multiple heads, with the work of the second head being performed with the printed circuit board being positioned in order from a downstream side position out of the multiple locations in relation to the progress direction of the printed circuit board.

Effects

According to the disclosure, it is possible to provide a board working device which is efficient and saves space.

BRIEF DESCRIPTION OF DRAWINGS

FIG. 1 is a plan view schematically illustrating an embodiment of the electronic component mounting device.

FIG. 2 is a plan view illustrating a printed circuit board according to the embodiment.

FIG. 3 is a side view (a partial section) illustrating an adhesive application head which is held in the electronic component mounting device and forms an adhesive application module.

FIG. 4 is a diagram illustrating a high-speed head.

FIG. 5 is a diagram illustrating a medium-speed head.

FIG. 6 is a diagram illustrating a low-speed head.

FIG. 7 is a diagram illustrating mounting order 1 in the conveyors according to embodiment 1 and embodiment 2.

FIG. 8 is a diagram illustrating mounting order 2 in the conveyors according to embodiment 1 and embodiment 2.

FIG. 9 is a diagram illustrating mounting order 3 in the conveyors according to embodiment 1.

FIG. 10 is a diagram illustrating mounting order 4 in the conveyors according to embodiment 1.

FIG. 11 is a diagram illustrating mounting order 5 in the conveyors according to embodiment 1.

FIG. 12 is a diagram illustrating mounting order 6 in the conveyors according to embodiment 1.

FIG. 13 is a diagram illustrating mounting order 3 in the conveyors according to embodiment 2.

FIG. 14 is a diagram illustrating mounting order 4 in the conveyors according to embodiment 2.

FIG. 15 is a diagram illustrating mounting order 5 in the conveyors according to embodiment 2.

FIG. 16 is a diagram illustrating the positioning of a printed circuit board by a stopper in the conveyors.

FIG. 17 is a diagram illustrating the positioning of the printed circuit board using a mark camera in the conveyors.

FIG. 18 is a diagram illustrating a method of searching for a mark on the printed circuit board in a case in which an abnormality is detected.

FIG. 19 is a diagram illustrating a method of searching for an edge of the printed circuit board in a case in which an abnormality is detected.

DESCRIPTION OF EMBODIMENTS

Example

Embodiments of a board working device will be described hereinafter based on the drawings. As illustrated in FIG. 1, electronic component mounting device 2 is provided with board conveyance devices 4, each of which carries printed circuit board 3 to a carry-in position and positions the printed circuit board 3 in a predetermined position, component supply device 5, component transfer device 12, which includes mounting head 10, and mark recognition camera 14 which are mounted on moving table 8 which is supported to be capable of moving in the X direction and Y direction which are horizontal directions in relation to base 6, component recognition camera 16 which is fixed to base 6, and control device 18 which controls the mounting by component transfer device 12.

Board conveyance device 4 is a so-called double conveyor type device, and each conveyor is provided with conveyor belts (not illustrated) which are provided along guide rails 20 which extend in the X direction, and which carry printed circuit board 3 to a predetermined position, the conveyor belts being provided parallel to each other, a support frame (not illustrated) which supports each of printed circuit boards 3 which are carried thereto, a lifting and lowering device (not illustrated) which lifts the supported printed circuit board 3 to a mounting position (a predetermined position), and a clamping device (not illustrated) which clamps the printed circuit board 3 in the position at which the printed circuit board 3 is subjected to mounting (a mounting position).

Component supply device 5 is provided with multiple cassette-type feeders 21 lined up at a side section (the front side in FIG. 1) of board conveyance devices 4. Cassette-type feeder 21 is provided with a case section which is attached to a slot in a detachable manner, a supply reel which is provided on the rear portion of the case section, and a component removal section which is provided on the leading end of the case section, all of which are not illustrated. A long and narrow tape (not illustrated) in which electronic components are sealed at a predetermined pitch is wound and held in the supply reel, the tape is pulled out at a predetermined pitch by a sprocket (not illustrated), the electronic components are released from the sealed state, and the electronic components are sequentially fed to the component removal section. A code (an identification code) is attached to cassette-type feeder 21 and correspondence data between the code and the ID, the component number, the number of sealed components, the weight of the component, and the like of the electronic component is recorded in advance in mounting program data which is transmitted to control device 18 from a host computer (not illustrated) which manages the entire line. Component tray 17 is arranged at a side section (the top portion side in FIG. 1) of the board conveyance devices 4, and large electronic components and the like are stored in component tray 17. These are also examples of component supply device 5.

X-direction movement beam 22 is provided above board conveyance devices 4, X-direction movement beam 22 extends in the Y-direction, and is provided to be capable of moving along X-direction rails not illustrated) which extend in the X direction along board conveyance devices 4. As illustrated in FIG. 1, on X-direction movement beam 22, moving table 8 is provided on a Y-direction rail (not illustrated) which is provided on a side surface of X-direction movement beam 22 to be capable of moving via a slider (not illustrated). Component transfer device 12 which is provided with mounting head 10, and mark recognition camera 14, are held on moving table 8 to be capable of moving together with moving table 8. X-direction movement beam 22 is driven by a servo motor via a ball screw mechanism, all of which are not illustrated, and moving table 8 is driven by a servo motor which is not illustrated via a Y-direction movement ball screw mechanism which is not illustrated. These servo motors drive X-direction movement beam 22 and moving table 8, being controlled by control device 18.

The optical axis of mark recognition camera 14 is parallel with the Z direction which is perpendicular to the X direction and the Y direction.

A captured image which is captured by mark recognition camera is inputted to an image recognition device which is not illustrated and is provided with an A/D converter which is not illustrated. The image recognition device imports the captured image and reads information from reference marks 106, 107, 108, and 109 (refer to FIG. 2). The positional shifting of the reference marks 106 and the like is computed by a computing device (not illustrated) which is provided in control device 18. Next, when mark recognition camera 14 is moved, the positional shifting is corrected before the moving.

In the embodiment, the mounting head 10 which is a work head is configured to be attachable to and detachable from component transfer device 12, and it is possible to select mounting head 10 from among multiple heads which have different configurations from each other and mount the selected mounting head 10. In other words, with component transfer device 12 it is possible to exchange the work be for one of a different type. FIGS. 3 to 6 illustrate a single application head 1100, illustrated in FIG. 3, and three mounting heads, 201a, 201b, and 201c, as examples of work heads which can be attached. To explain each simply, mounting head 201a illustrated in FIG. 4 is a work head provided with multiple (eight) mounting units 1400 which are substantially shaft-shaped, and rotates mounting units 1400 using index rotation. To explain the operations of mounting head 201a simply, suction nozzle 142 is included on the bottom end portion of mounting unit 1400 as a component holding device which picks up and holds a component. By lowering one of the mounting units 1400 in a state in which mounting head 201a is positioned above cassette-type feeder 21 and causing suction nozzle 142 which is included in mounting unit 1400 to pick up an electronic component which is supplied at the component supply position of cassette-type feeder 21, the electronic component is removed. Mounting unit 1400 is intermittently rotated, and each of the suction nozzle 142 sequentially picks up an electronic component. Mounting head 201a is moved to above the printed circuit board which is held in the clamping device in a fixed manner in a state in which each of the mounting units 1400 is holding an electronic component. Above the printed circuit board, a mounting unit 1400, which is positioned in the position at which the mounting unit 1400 is lowered when picking up a component, is lowered, and the electronic component which is held by the mounting unit 1400 is mounted on the surface of the printed circuit board. Mounting unit 1400 is intermittently rotated, and the electronic components which are held by each of the mounting units 1400 are sequentially mounted on the printed circuit board. Mounting head 201a is a work head which performs the operations described above, and is a work head (a high-speed head) which is suitable for high speed mounting of comparatively small electronic components. Note that, although not illustrated, as a work head of the same type as mounting head 201a, there are work heads in which the number of mounting units 1400 which are equipped is different.

Mounting head 201c illustrated in FIG. 6 is a work head equipped with a single mounting unit 1400, and is configured to lower the mounting unit 1400 above the cassette-type feeder 21 and above. The printed circuit board, and to mount one electronic component for each movement between the cassette-type feeder 21 and the printed circuit board. Although the mounting speed of mounting head 201c is comparatively slow, mounting head 201c is a work head (a low-speed head) on which it is possible to mount a comparatively large suction nozzle 142, thus it is possible to mount a large electronic component with a special shape, which gives the work head excellent general applicability.

Mounting head 201b illustrated in FIG. 5 is a mounting head which includes two mounting units 1400, and is a work head (a medium-speed head) which has intermediate characteristics between mounting head 201a and mounting head 201c. Note that, of the two mounting units 140, the mounting unit 1400 on the front side includes multiple suction nozzles 142 which are arranged radially around an axial line which is perpendicular to the axial line of mounting unit 1400, and the suction nozzles 142 have a structure in which the nozzle to be used is selected by rotating the suction nozzles 142 around the axial line. Component transfer device 12 is capable of being attached with one work head selected from the work heads described above according to the form of the mounting work. Note that, component transfer device 12 exchanges the work head, as appropriate, in exchanging devices 401 of FIG. 1.

Application head 1100 is provided with lifting and lowering member 1104 which is held in a head main body to be capable of being lifted and lowered as illustrated in FIG. 3. Lifting and lowering member 1104 is lifted and lowered by a lifting and lowering device (not illustrated) which is provided in the head main body. Adhesive application tool 1106 is loaded on the lifting and lowering member 1104. For example, adhesive application tool 1106 is configured in the same manner as the adhesive application tool described in Japanese Patent No. 3242120, and includes application nozzle 1108 and a syringe 1110 as an adhesive storage receptacle. Adhesive 1112, which is a type of high viscosity fluid, is stored in syringe 1110, and if compressed air is supplied from a compressed sir supply source which is not illustrated into syringe 1110, the adhesive is ejected through ejection tube 1114, and a predetermined amount is applied to printed circuit board 3.

Component recognition camera 16 is provided between board conveyance devices 4 and component supply device 5, the electronic component which is held by suction nozzle 142 is imaged by component recognition camera 16, and it is determined whether the electronic component is a type which is suitable for the type of the printed circuit board which is being produced, whether the holding state is good, whether there are faulty locations on the component itself, and the like.

Input device 42, such as a keyboard, for inputting board data, component data, and the like is provided on electronic component mounting device 2. Display device 44 is also provided on input device 42, and it is possible to display the board data, the component data, computed data, and an image which is captured by mark recognition camera 14 or the like, on the screen of display device 44.

Here, description will be given of exchanging devices 401. Application head 1100, and mounting heads 201a, 201b, and 201c can be loaded in exchanging devices 401. According to the instructions of control device 18, component transfer device 12 loads mounting head 10 in a vacant space inside exchanging devices 401, and mounts a work head to be mounted from exchanging device 401. In this manner, all of application head 1100, and mounting heads 201a, 201b, and 201c are able to be mounted on component transfer device 12.

Description will be given of embodiment 1 using FIGS. 2, and 7 to 12. FIG. 2 is a plan view of printed circuit board which is produced by the embodiment. Area 101, area 102, and area 103 are present on printed circuit board 3. A first mounting area indicates area 101 and area 102, and a second mounting area indicates area 102 and area 103. Reference marks 106 and 107 for the first mounting area and reference marks 108 and 109 for the second mounting area are on printed circuit board 3.

FIG. 7 illustrates mounting order 1 in the conveyors according to embodiment 1. Printed circuit board 3 is conveyed by board conveyance device 4, and stops due to stopper 140. Clamping devices 104 and 105 clamp printed circuit board 3. In the embodiment, the lengths of clamping devices 104 and 105 in the conveyance direction correspond to a range in which it is possible to mount clamp devices 104 and 105 to electronic component mounting device 2. Electronic component mounting device 2 recognizes reference marks 106 and 107 for the first mounting area using mark recognition camera 14 and computes the positional shifting of reference mark 106 and the like using the computing device (not illustrated) which is provided in control device 18. The computation results are used in correction during the mounting of electronic components. At this time, component transfer device 12 mounts the mounting head 201a as the work head. Next, the electronic component mounting device 2 picks up electronic components 122 and 125 from component supply device 5 using mounting head 201a and mounts electronic components 122 and 125 to predetermined locations on printed circuit board 3.

FIG. 8 illustrates mounting order 2 in the conveyors according to embodiment 1. Printed circuit board 3 is conveyed by board conveyance device 4, and stops at a predetermined stopping position. Stopper 140 is withdrawn by a cylinder which is not depicted in the drawings so as not to impede the conveying of printed circuit hoard 3. Clamping devices 104 and 105 clamp printed circuit board 3. Electronic component mounting device 2 recognizes reference marks 108 and 109 for the second mounting area using mark recognition camera 14 and computes the positional shifting of reference mark 108 and the like using the computing device (not illustrated) which is provided in control device 18. The computation results are used in correction during the mounting of electronic components. At this time, component transfer device 12 mounts mounting head 201a as the work head. Next, electronic component mounting device 2 picks up electronic components 128 and 131 using mounting head 201a and mounts electronic components 128 and 131 from component supply device 5 to predetermined locations on printed circuit board 3.

FIG. 9 illustrates mounting order 3 in the conveyors according to embodiment 1. Printed circuit board 3 remains in a state of being clamped by clamping devices 104 and 105. Since electronic component mounting device 2 recognizes reference marks 108 and 109 for the second mounting area using mark recognition camera 14 in the state of FIG. 8, no further recognition is performed. Component transfer device 12 mounts mounting head 201b as the work head using exchanging device 401. Next, electronic component mounting device 2 picks up electronic components 127 and 130 from component supply device 5 using mounting head 201b and mounts electronic components 127 and 130 to predetermined locations on printed circuit board 3.

FIG. 10 illustrates mounting order 4 in the conveyors according to embodiment 1. Printed circuit board 3 is conveyed by board conveyance device 4 in the opposite direction from the progress direction hereunto, and stops at a predetermined stopping position. Here, the board conveyance device 4 may convey the printed circuit board further than the predetermined stopping position, further convey the printed circuit board in the original progress direction, and cause printed circuit board 3 to stop using stopper 140. Clamping devices 104 and 105 clamp printed circuit board 3. Electronic component mounting device 2 recognizes reference marks 106 and 107 for the first mounting area using mark recognition camera 14 and computes the positional shifting of reference mark 106 and the like using the computing device (not illustrated) which is provided in control device 18. At this time, the component transfer device 12 mounts mounting head 201b as the work head. Next, electronic component mounting device 2 picks up electronic components 121 and 124 from component supply device 5 using mounting head 201b and mounts electronic components 121 and 124 to predetermined locations on the printed circuit board 3.

FIG. 11 illustrates mounting order 5 in the conveyors according to embodiment 1. Printed circuit board 3 remains, in a state of being clamped by clamping devices 104 and 105. Since electronic component mounting device 2 recognizes reference marks 106 and 107 for the first mounting area using mark recognition camera 14 in the state of FIG. 10, no further recognition is performed. Component transfer device 12 mounts mounting head 201c as the work head using exchanging device 401. Next, electronic component mounting device 2 picks up electronic components 120 and 123 from component supply device 5 using mounting head 201c and mounts the electronic components 120 and 123 to predetermined locations on printed circuit board 3.

FIG. 12 illustrates mounting order 6 in the conveyors according to embodiment 1. Printed circuit board 3 is conveyed by board conveyance device 4, and stops at a predetermined stopping position. Stopper 140 is withdrawn by a cylinder which is not depicted in the drawings so as not to impede the conveying of printed circuit board 3. Clamping devices 104 and 105 clamp printed circuit board 3. Electronic component mounting device 2 recognizes reference marks 108 and 109 for the second mounting area using mark recognition camera 14 and computes the positional shifting of reference mark 108 and the like using the computing device (not illustrated) which is provided in control device 18. The computation results are used in correction during the mounting of electronic components. At this time, component transfer device 12 mounts mounting head 201c as the work head. Next, electronic component mounting device 2 picks up electronic components 126 and 129 from component supply device 5 using mounting head 201c and mounts electronic components 126 and 129 to predetermined locations on printed circuit board 3.

Description will be given of mounting order 3 to mounting order 5 for embodiment 2 using FIGS. 13 to 15. Embodiment 2 indicates a case in which the electronic components to be mounted by mounting head 201b in the first mounting area are gone from embodiment 1. In other words, mounting order 4 of FIG. 10 is omitted from embodiment 1, and mounting order 5 (FIG. 11) switches places with mounting order 6 (FIG. 12).

FIG. 13 illustrates mounting order 3 in the conveyors according to embodiment 2. Printed circuit board 3 remains in a state of being clamped by clamping devices 104 and 105. Since electronic component mounting device 2 recognizes reference marks 108 and 109 for the second mounting area using mark recognition camera 14 in the state of FIG. 8, no further recognition is performed. Component transfer device 12 mounts mounting head 201b as the work head using exchanging device 401. Next, electronic component mounting device 2 picks up electronic components 127 and 130 from component supply device 5 using mounting head 201b and mounts electronic components 127 and 130 to predetermined locations on the printed circuit board 3.

FIG. 14 illustrates mounting order 4 in the conveyors according to embodiment 2. Printed circuit board 3 remains in a state of being clamped by clamping devices 104 and 105. Since electronic component mounting device 2 recognizes reference marks 108 and 109 for the second mounting area using mark recognition camera 14 in the state of FIG. 8, no further recognition is performed. Component transfer device 12 mounts mounting head 201c as the work head using exchanging device 401. Next, electronic component mounting device 2 picks up electronic components 126 and 129 from component supply device 5 using mounting head 201c and mounts electronic components 126 and 129 to predetermined locations on printed circuit board 3.

FIG. 15 illustrates mounting order 5 in the conveyors according to embodiment 2. Printed circuit board 3 is conveyed by board conveyance device 4 in the opposite direction from the progress direction hereunto, and stops at a predetermined stopping position. Here, board conveyance device 4 may convey the printed circuit board further than the predetermined stopping position, further convey the printed circuit board in the original progress direction, and cause printed circuit board 3 to stop using stopper 140. Clamping devices 104 and 105 clamp printed circuit board 3. Electronic component mounting device 2 recognizes reference marks 106 and 107 for the first mounting area using mark recognition camera 14 and computes the positional shifting of reference mark 106 and the like using the computing device (not illustrated) which is provided in control device 18. At this time, component transfer device 12 mounts mounting head 201c as the work head. Next, electronic component mounting device 2 picks up electronic components 120 and 123 from component supply device 5 using mounting head 201c and mounts electronic components 120 and 123 to predetermined locations on the printed circuit board 3.

Performing the board working in the order of the application head, the high-speed head, the medium-speed head, and the low-speed head as described above leads to optimization since the work is performed in order from the shortest distance between the printed circuit board and the head. For example, it is possible to reduce the recognition of the reference marks as when the mounting order changes from FIG. 8 to FIG. 9. The embodiment is explained in terms of the high-speed head, the medium-speed head, and the low-speed head; however, it is possible to use the application head in the same manner.

Since, when the printed circuit board is carried in from a previous step of another electronic component mounting device or the like, the stopper is used, and when the printed circuit board is conveyed within the device, the positioning of the printed circuit board is performed using the mark recognition camera, it is possible to reduce the number of mechanical mechanisms such as stoppers while supporting the carrying in from a previous step in which the positional shifting of the printed circuit board is great.

In a case in which an abnormality is detected in the positioning, as in FIGS. 18 and 19, it is possible to retry the positioning of the printed circuit board 3 by recognizing the reference marks or an edge of the printed circuit board while conveying printed circuit board 3 forward and backward in the progress direction using board conveyance device 4.

Note that, in the embodiment, a double conveyor is exemplified for board conveyance device 4; however, the embodiment is not limited thereto, a single conveyor or a triple conveyor may be used, and a mode including a return conveyor may be used. The mounting area is not limited to a portion corresponding to the rails, and includes a predetermined range within the board conveyance device. It is satisfactory for the clamping device to be capable of clamping a printed circuit board, and the system of the clamp device may include a system of clamping from the sides and a system of clamping from a vertical direction. In a vertical direction clamp, a top side member may operate, a bottom side member may operate, or a member of both sides may operate.

A case in which there are two reference marks for a single area, and there are two areas for a single printed circuit board is exemplified; however, the embodiment is not limited thereto, and a mode in which three or more are present may also be adopted.

Inside the board working device refers to a state in which it is possible to perform work in the board working device, and includes a case in which an edge of the printed circuit board overhangs from the device. Board working is a concept including application, mounting, and inspection.

There is a case in which back-up pins are provided inside the board working device. In the present embodiment, in particular, in a case in which electronic components are already mounted to the opposite side from the mounting surface of the printed circuit board 3, it is preferable that backup pins are arranged in common positions in the first mounting area and the second mounting area.

Elements which share the functions of any of the application head, the high-speed head, the medium-speed head, and the low-speed head are included in the disclosure. The exchanging device may exchange two or more heads.

REFERENCE SIGNS LIST

2: electronic component mounting device, 3: printed circuit board, 4: board conveyance device, 5: component supply device, 6: base, 8: moving table, 10: mounting head, 12: component transfer device, 14: mark recognition camera, 16: component recognition camera, 17: component tray, 18: control device, 20: guide rail, 21: cassette-type feeder, 22: X-direction movement beam, 30: printed circuit board, 42: input device, 44: display device, 101: area, 102: area, 103: area, 106: reference mark, 107: reference mark, 108: reference mark, 109: reference mark, 110: board edge, 120: electronic component, 121: electronic component, 122: electronic component, 123: electronic component, 124: electronic component, 125: electronic component, 126: electronic component, 127: electronic component, 128: electronic component, 129: electronic component, 130: electronic component, 131: electronic component, 140: stopper, 301: mark recognition camera visual field, 401: exchanging device, 1100: application head, 1104: lifting and lowering member, 1106: adhesive application tool, 1108: application nozzle, 1110: syringe, 1112: adhesive, 1114: ejection tube.

The invention claimed is:

1. A board working device comprising:
a board conveyance device which conveys a printed circuit board and positions the printed circuit board at multiple locations in the board working device;
multiple heads that perform work on the printed circuit board positioned at a working position; and
a control device which performs control such that the printed circuit board is positioned in the multiple locations in order from an upstream side in relation to a progress direction of the printed circuit board, and work performed using a first head of the multiple heads, and further, once the work is completed by the first head at the most downstream side position out of the multiple locations in relation to the progress direction of the printed circuit board, performs control such that work is started using a second head of the multiple heads, with the work of the second head being performed with the printed circuit board being positioned in order from a downstream side position out of the multiple locations in relation to the progress direction of the printed circuit board,
wherein the control device performs control such that, once the work of the second head of the multiple heads is completed, the work of a third head of the multiple heads is performed with the printed circuit board being positioned in order from the upstream side position out of the multiple locations in relation to the progress direction of the printed circuit board, and
wherein the board working device further comprises:
a selection device which performs selection of the multiple heads in order of an application head, a high-speed head, a medium-speed head, and a low-speed head, and
an exchanging device which exchanges the application head, the high-speed head, the medium-speed head, and the low-speed head.

2. The board working device according to claim 1, wherein a edge of the printed circuit board overhangs a case of the board working device.

3. A board working device comprising:
a board conveyance device which conveys a printed circuit board and positions the printed circuit board at multiple locations in the board working device;
multiple heads that perform work on the printed circuit board positioned at a working position; and
a control device which performs control such that the printed circuit board is positioned in the multiple locations in order from an upstream side in relation to a progress direction of the printed circuit board, and work performed using a first head of the multiple heads, and further, once the work is completed by the first head at the most downstream side position out of the multiple locations in relation to the progress direction of the printed circuit board, performs control such that work is started using a second head of the multiple heads, with the work of the second head being performed with the printed circuit board being positioned in order from a downstream side position out of the multiple locations in relation to the progress direction of the printed circuit board,
wherein positioning of the printed circuit board in the most upstream side position out of the multiple locations in relation to the progress direction of the printed circuit board is performed by a positioning device which is provided in the board conveyance device, and
wherein the board working device further comprises a positioning control device which includes a moving device which moves the multiple heads, and has a board position detection device which performs the positioning of the printed circuit board at positions other than the most upstream side position out of the multiple locations in relation to the progress direction of the printed circuit board.

4. The board working device according to claim 3, wherein, in a case in which an abnormality is detected in relation to the positioning other than for the most upstream side position, detecting a detection target which is attached to the printed circuit board or an edge of the printed circuit board is performed by the board position detection device.

5. A board working device comprising:
a board conveyance device which conveys a printed circuit board and positions the printed circuit board at multiple locations in the board working device;
multiple work devices heads that perform work on the printed circuit board positioned at a working position, the multiple work device heads including an application head, a high-speed head, a medium-speed head, and a low-speed head; and
a control device which performs control such that the printed circuit board is positioned in the multiple locations in order from an upstream side in relation to a progress direction of the printed circuit board, and work performed using a first work device head of the multiple work devices heads, and further, once the work is completed by the first work device head at the most downstream side position out of the multiple locations in relation to the progress direction of the printed circuit board, performs control such that work is started using a second work device head of the multiple work devices heads, with the work of the second work device head being performed with the printed circuit board being positioned in order from a downstream side position out of the multiple locations in relation to the progress direction of the printed circuit board, and
wherein the board working device further comprises:
a selection device which performs selection of the multiple work devices heads in order of an application head, a high-speed head, a medium-speed head, and a low-speed head such that the board working device uses at least two heads of the four heads, and
an exchanging device which exchanges the application head, the high-speed head, the medium-speed head, and the low-speed head such that the board working device uses at least two heads of the four heads.

6. The board working device according to claim 3,
wherein a edge of the printed circuit board overhangs a case of the board working device.

7. The board working device according to claim 5,
wherein a edge of the printed circuit board overhangs a case of the board working device.

\* \* \* \* \*